(12) United States Patent
Eslami et al.

(10) Patent No.: US 11,858,436 B2
(45) Date of Patent: Jan. 2, 2024

(54) METHOD FOR PREDICTING IMMANENT DAMAGE TO A CONNECTING POINT BETWEEN TWO ELECTRICAL CONDUCTORS IN A MOTOR VEHICLE ELECTRICAL SYSTEM, DEVICE AND MOTOR VEHICLE

(71) Applicant: Volkswagen Aktiengesellschaft, Wolfsburg (DE)

(72) Inventors: Nima Eslami, Göttingen (DE); Alexander Harms, Oebisfelde (DE); Daniel Keil, Hannover (DE)

(73) Assignee: VOLKSWAGEN AKTIENGESELLSCHAFT, Wolfsburg (DE)

(*) Notice: Subject to any disclaimer, the term of this patent is extended or adjusted under 35 U.S.C. 154(b) by 430 days.

(21) Appl. No.: 16/968,486

(22) PCT Filed: Jan. 11, 2019

(86) PCT No.: PCT/EP2019/050665
§ 371 (c)(1),
(2) Date: Aug. 7, 2020

(87) PCT Pub. No.: WO2019/154584
PCT Pub. Date: Aug. 15, 2019

(65) Prior Publication Data
US 2020/0398774 A1    Dec. 24, 2020

(30) Foreign Application Priority Data
Feb. 8, 2018   (DE) ............ 10 2018 202 010.8

(51) Int. Cl.
*B60R 16/03*   (2006.01)
*G01R 31/364*  (2019.01)
(Continued)

(52) U.S. Cl.
CPC .............. *B60R 16/03* (2013.01); *G01R 27/16* (2013.01); *G01R 31/006* (2013.01);
(Continued)

(58) Field of Classification Search
CPC ...... B60R 16/03; G01R 27/16; G01R 31/006; G01R 31/364; G01R 31/66; H01M 10/48;
(Continued)

(56) References Cited

U.S. PATENT DOCUMENTS

| 9,252,418 B2 | 2/2016 | Achhammer |
| 2009/0027056 A1* | 1/2009 | Huang ............... G01R 31/392 320/132 |

(Continued)

FOREIGN PATENT DOCUMENTS

| CN | 103926466 A | 7/2014 | ............ G01R 27/14 |
| CN | 105510842 A | 4/2016 | ............ G01R 27/14 |

(Continued)

OTHER PUBLICATIONS

German Office Action, Application No. 102018202010.8, 6 pages, dated Jul. 30, 2018.

(Continued)

*Primary Examiner* — Akm Zakaria
(74) *Attorney, Agent, or Firm* — Slayden Grubert Beard PLLC

(57) ABSTRACT

A method for predicting immanent damage to a connecting point between two electrical conductors in a motor vehicle electrical system is disclosed, wherein a value of an electrical variable is ascertained that is at least related to an electrical resistance of the connecting point, and wherein the prediction of the immanent damage is made depending on the value of the electric variable. The value of the electrical variable is repeatedly determined while the motor vehicle electrical system is in operation while an operating current of specified operating current strength flows through the connection point.

18 Claims, 2 Drawing Sheets

(51) Int. Cl.
*G01R 31/66* (2020.01)
*G01R 27/16* (2006.01)
*G01R 31/00* (2006.01)
*H01M 10/48* (2006.01)

(52) U.S. Cl.
CPC ............ *G01R 31/364* (2019.01); *G01R 31/66* (2020.01); *H01M 10/48* (2013.01)

(58) Field of Classification Search
CPC ............ H01M 2220/20; B60L 2250/10; B60L 3/0069; Y02E 60/10; Y02T 10/70
See application file for complete search history.

(56) References Cited

U.S. PATENT DOCUMENTS

| | | | |
|---|---|---|---|
| 2012/0035870 A1* | 2/2012 | Bertness | G01R 31/006 33/503 |
| 2012/0290228 A1 | 11/2012 | Lev et al. | 702/58 |
| 2013/0187671 A1 | 7/2013 | Widhalm | 324/691 |
| 2013/0337294 A1* | 12/2013 | Achhammer | H02J 7/00309 429/61 |
| 2020/0156477 A1* | 5/2020 | Hansen | G01R 27/025 |
| 2021/0311131 A1* | 10/2021 | Gundel | G01K 7/42 |
| 2021/0359515 A1* | 11/2021 | Betak | H02J 13/00002 |

FOREIGN PATENT DOCUMENTS

| | | | |
|---|---|---|---|
| DE | 3445213 A1 | 6/1986 | ............ G01R 27/14 |
| DE | 102006060521 A1 | 6/2008 | ............ B60R 16/02 |
| DE | 102011013394 A1 | 9/2012 | ............ G01R 31/02 |
| DE | 102012207616 A1 | 11/2012 | ............ G01D 5/16 |
| DE | 102013200632 A1 | 7/2013 | ............ G01R 27/00 |
| DE | 102014202394 A1 | 8/2015 | ............ G01R 27/14 |
| DE | 102018202010 A1 | 8/2019 | ............ G01R 27/14 |
| WO | 2019/154584 A1 | 8/2019 | ............ B60L 15/10 |

OTHER PUBLICATIONS

International Search Report and Written Opinion, Application No. PCT/EP2019/050665, 8 pages, dated Mar. 20, 2019.
Chinese Office Action, Application No. 201980012584.5, 11 pages, dated May 31, 2022.

* cited by examiner

METHOD FOR PREDICTING IMMANENT DAMAGE TO A CONNECTING POINT BETWEEN TWO ELECTRICAL CONDUCTORS IN A MOTOR VEHICLE ELECTRICAL SYSTEM, DEVICE AND MOTOR VEHICLE

CROSS-REFERENCE TO RELATED APPLICATIONS

This application claims priority to German Patent Application No. DE 10 2018 202 010.8, filed on Feb. 8, 2018 with the German Patent and Trademark Office. The contents of the aforesaid patent application are incorporated herein for all purposes.

TECHNICAL FIELD

The invention relates to a method for predicting immanent damage to a connecting point between two electrical conductors in a motor vehicle electrical system, wherein a value of an electrical variable is ascertained that is at least related to an electrical resistance of the connecting point, and wherein the prediction of the immanent damage is made depending on the value of the electric variable. Moreover, the invention also includes a motor vehicle electrical system as well as a motor vehicle.

BACKGROUND

This background section is provided for the purpose of generally describing the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

Given the increasing electrification of the automobile drive system, electrically conductive materials are increasingly being used. In this context, the focus is also increasingly on joint connections consisting of various materials. Current-conducting components are subject to cyclical mechanical stresses during operation, such as by vibrations. In this case, damage can occur to conductors through which current flows that, in a joined connection, generally arises at the joint. To identify a component failure early on and prevent a malfunction, it would be helpful to be able to predict a potential component failure before it occurs.

Since joint connections are also used in battery systems of electrified vehicles and component damage within such a battery can have particularly serious consequences, CN 105510842 proposes a battery module monitoring apparatus in which resistances of the individual battery modules as well as module combinations are measured for monitoring the battery, which however necessitates very complex circuits.

Moreover, US 2012/0290228 A1 describes a method for measuring the electrical resistance of connecting points. An excessively high resistance at such a connecting point indicates that the connecting point no longer has a sufficiently high connection quality. However to measure these resistances, a constant current is applied by a separately provided power source. Disadvantageously, this can only occur if an operating current does not also flow through the connecting point since this would lead to incorrect measuring results. Even though in principle a prediction of immanent damage of such a connecting point is possible through this method described therein, connecting points can also only be checked in a relatively involved manner and only under certain circumstances, i.e., not during operation and therefore only very rarely as well, which in turn is restrictive for a timely recognition of immanent damage.

US 2013/0187671 A1 as well describes a method for ascertaining a quality of a connecting point between two electrical conductors, in particular also within a battery, by using the resistance value of the connecting point. In this case, a check cannot however occur when the battery is in an installed state in a motor vehicle, but rather only before being installed in a motor vehicle or during an inspection. This also stands in the way of a timely recognition of immanent damage to a connecting point since only random tests are correspondingly possible.

DE 10 2006 060 521 A1 describes an aging meter for vehicle components, in particular for fuel cell stacks. In this case, a state of wear is determined while the vehicle is being driven. With the assistance of a data filter, measured data that are available in the electrical system of a motor vehicle and that fall into one or more given parameter windows in the proximity of one or more observation states are recorded and projected onto these observation states with the assistance of a function. These projected measured data are averaged over an observation period in order to reduce the spread, or respectively the variance.

SUMMARY

An object exists to provide a method for predicting immanent damage to a connecting point, a device, and a motor vehicle that enable earliest possible recognition of immanent damage to the connecting point in a particularly easy manner.

This object is solved by a method, a device for a motor vehicle electrical system, and a motor vehicle having the features according to the respective independent claims. Embodiments are described in the dependent claims, the description, and the FIGS.

DETAILED DESCRIPTION

Figure 1:
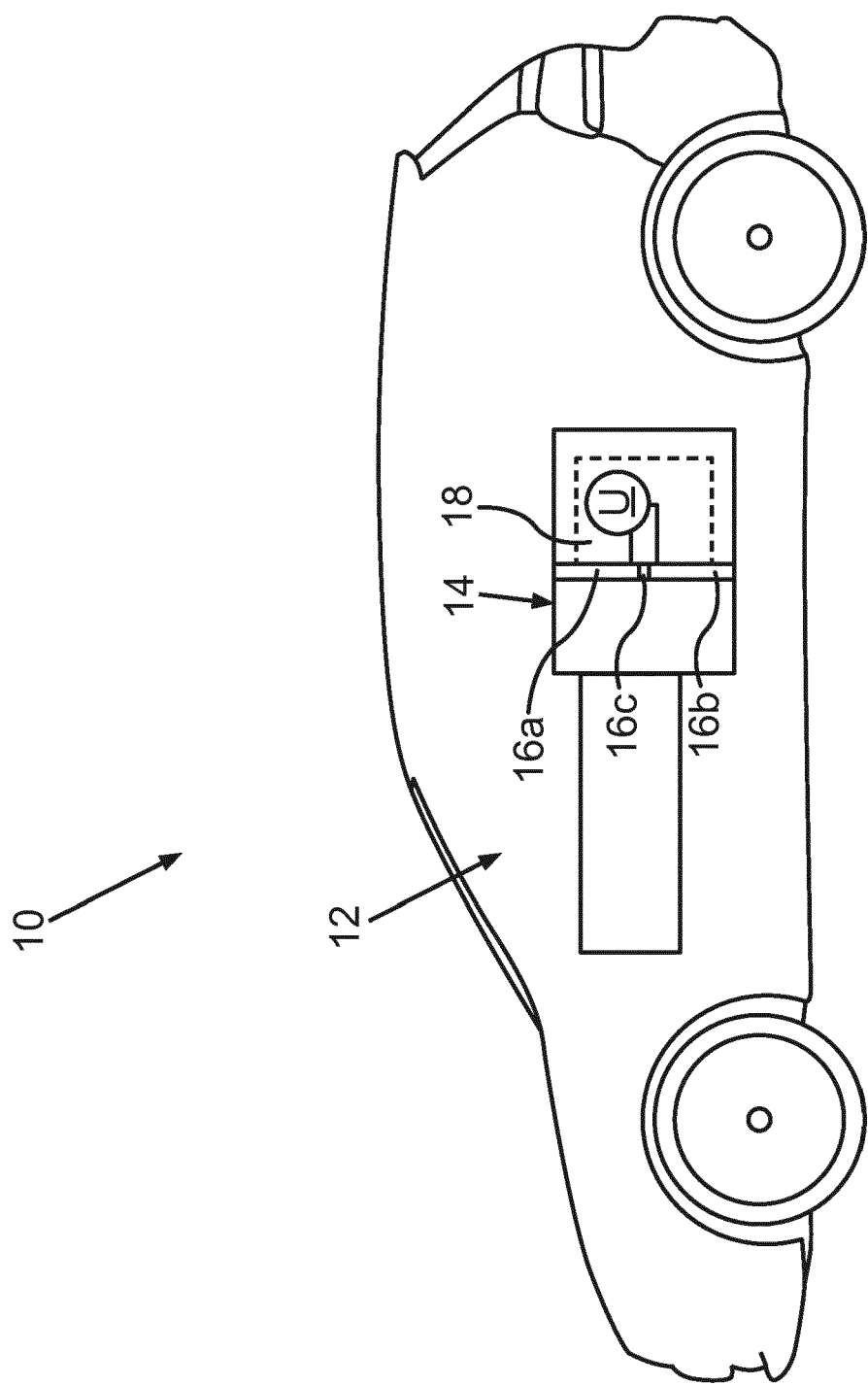
FIG. 1 shows a schematic representation of a motor vehicle with a motor vehicle electrical system, a high-voltage battery and a measuring apparatus for predicting imminent damage to a connecting point between two electrical conductors of the high-voltage battery according to an exemplary embodiment.

In a method according to a first exemplary aspect for predicting immanent damage to a connecting point between two electrical conductors in a motor vehicle electrical system, a value is ascertained of an electrical variable that is related to at least one electrical resistance of the connecting point. This electrical variable may hence for example represent a variable different from the electrical resistance that, however, is proportional to the electrical resistance of the connecting point for example, or it may also represent the electrical resistance of the connecting point itself. Moreover, the prediction of the imminent damage is made depending on the value of the electrical variable. In doing so, the value of the electrical variable is repeatedly ascertained while the motor vehicle electrical system is in operation while an operating current of a determined operating current strength flows through the connection point.

To measure the electrical variable, or respectively its value, the operating current itself may hence be beneficially used that flows through the connecting point during operation of the vehicle electrical system. This has several benefits, because monitoring the electrical variable and therefore the electrical resistance of the connecting point as well may be accordingly provided more or less permanently during operation and, at the same time, also using particularly easy means since a separate power source does not have to be offered to provide a predetermined test current. This allows imminent damage to a connecting point to be provided very economically, efficiently and especially in a timely manner.

In this context, a "connecting point" may generally be understood to be a point at which two conductors are connected to each other in any desired manner, such as for example joint connections like welded connections, screwed connections, soldered connections or riveted connections. Moreover, the two electrical conductors that are electrically connected to each other at the connecting point may be of the same material or may also be formed from different materials. For example, at least one of the two electrical conductors comprises copper and/or aluminum. Copper materials in particular are distinguished by their particularly favorable electrical and thermal properties. Joint connections consisting of copper and aluminum are particularly suitable in this case for producing lower cost as well as lower weight conductors through which current flows. Moreover, the method and its embodiments may be easily used for any desired connecting point. For example, any desired connecting point in a motor vehicle electrical system may thus be monitored. Since however such connecting points occur frequently within a battery of a motor vehicle, it is beneficial if the connecting point between the two electrical conductors is a connecting point within a battery, such as a traction battery. For example, the connecting point may connect one pole of a battery module to a bus bar.

If a plurality of connecting points are to be monitored for imminent damage by means of the method according to the present aspect or one of the embodiments described herein, these may be implemented separately for a particular connecting point. That is, the electrical variable is ascertained for a particular connecting point which is to be monitored, in particular as described above and also below in greater detail. Each connecting point to be monitored may therefore be beneficially monitored separately. This not only allows imminent damage to be recognized in a timely manner, it may also be located when it occurs.

In an embodiment, the electrical variable represents the electrical resistance of the connecting point itself, wherein the electrical resistance is determined by means of four-terminal measurement. The voltage drop over the connecting point may be easily measured according to four-terminal measurement. This measured voltage drop divided by the determined operating current strength with which the operating current flows through the connecting point at the measuring time supplies the electrical resistance of the connecting point. A simple voltmeter may be used to determine the electrical resistance of the connecting point in order to tap the voltage drop across the connecting point to influence the flow of current through the connecting point as little as possible. The voltage value measured in this way may then be divided by the known operating current strength. Alternatively, a resistance meter may also be used directly, such as an ohmmeter or respectively a micro-ohmmeter that ascertains the electrical resistance as described and provides it directly as an output variable. By means of these measures, it is possible to monitor the electrical resistance of the connecting point without significant additional effort while the component is operating, i.e., while an operating current is flowing through the connecting point, and to predict imminent damage based thereupon in a timely manner.

In determining the resistance, in particular the determined operating current strength which flows through the connecting point is assumed to be known. Either the operating current is detected by a corresponding measuring unit such as a shunt resistor which occurs in any case in many components of a motor vehicle electrical system, especially within a battery system, or the connecting point is located at a point through which a given and constant operating current strength already flows. If this is the case for example, i.e., the connecting point is located at a position within the motor vehicle electrical system through which a predetermined and constant operating current already flows, the dropping voltage per se across the connecting point may also be monitored instead of the electrical resistance of the connecting point since in this case it differs from the electrical resistance of the connecting point only in terms of a constant factor that is the same as the operating current strength.

In another embodiment, it is therefore provided that a voltage drop across the connecting point is measured as the electrical variable. In this case, imminent damage may therefore also be detected directly depending on this measured voltage drop, in particular without necessarily also calculating the electrical resistance of the connecting point from the voltage drop.

Moreover, other variables than the electrical variable may also be ascertained that are related to the electrical resistance of the connecting point and for example are proportional to the electrical resistance of the connecting point and therefore allow conclusions about it. In some examples, indirect proportionality should also be considered to be covered by the term proportionality. Correspondingly, the electrical variable may also represent the current electrical conductivity of the connecting point.

Independent of whether the voltage drop across the connecting point represents the electrical variable or the electrical resistance itself, the voltage drop across the connecting point is measured. The prediction of imminent damage may then either be determined directly by the currently measured voltage drop value, for example given a constant operating current strength, or it may be ascertained from the measured voltage drop value of the electrical resistance or the electrical conductivity of the connecting point, and then the prediction may be made about the existence of imminent damage to the connecting point.

In this case, it is also beneficial if the repeatedly ascertained value of the electrical variable, i.e., for example the ascertained voltage drop value, the ascertained value of the electrical resistance, or the ascertained value of the electrical conductivity of the connecting point is compared with a predetermined limit value to predict the imminent damage.

Imminent damage to the connecting point may be inferred from increased electrical resistance, and correspondingly, given a constant operating current, when the voltage drop across the connecting point is elevated or electrical conductivity of the connecting point is lower. In other words, imminent damage to the connecting point may be predicted in a particularly easy manner by comparing the repeatedly ascertained electrical variable to a predetermined limit value.

In another embodiment, a currently ascertained value of the electrical variable is compared with at least one of the preceding values of the electrical variable to predict the imminent damage. In contrast to comparing the electrical variable with a predetermined limit value, this embodiment is particularly beneficial for the following reasons: In order to be able to establish in advance a suitable limit value for the repeatedly ascertained electrical variable, the mechanical and/or electrical properties of the connecting point must be known such as for example the electrical resistance of the connecting point in a flawless, operable state of the connecting point in which no damage to the connecting point exists and is not soon imminent. For various types of connecting points, particular suitable limit values must be as established, for example by experimentally determining at equivalent connecting points. Contrastingly in a comparison of the electrical variable with at least one of the preceding values of the electrical variable, it is unnecessary to possess knowledge of the mechanical or electrical properties of the connecting point. This is based on the awareness that the electrical resistance of a connecting point rises within a short period before it is actually damaged. In normal operation, i.e., when damage to the connecting point is not imminent, the electrical resistance of the connecting point remains nearly constant over a long time. A rise in the electrical resistance in comparison to its previous nearly constant value is only found shortly before damage, such as for example a crack or even a break. Even if a break at the connecting point should occur, the electrical resistance of the connecting point would not rise abruptly beforehand, but rather continuously. This continuous rise may be detected by observing the repeatedly ascertained values of the electrical variable, such as by comparing each new, or respectively currently ascertained value of the electrical variable with at least one of the preceding values of the electrical variable. If a current value is higher than a proceeding value, or if sequentially ascertained values have a rising trend at least on average, such as when the electrical variable represents the electrical resistance itself or the voltage drop across the connecting point, it may be concluded that damage to the connecting point is imminent.

Consequently, another embodiment exists when imminent damage is recorded if a currently ascertained value of the electrical variable has a predetermined significant change, such as an increase, in comparison to at least one of the preceding values of the electrical variable ascertained beforehand. If in contrast the electrical resistance itself or the voltage drop is not considered as the electrical variable, but rather the electrical conductivity of the connecting point, imminent damage may be analogously detected when the currently ascertained value of the electrical variable has a predetermined significant decrease, or respectively reduction in comparison to at least one of the previously ascertained values of the electrical variable. In this case, a particular current value cannot only be compared with a preceding value, but also with several. For example, a particular currently ascertained value may be compared with an average that is composed of a predetermined number of previously ascertained values. Through averaging, measuring imprecisions do not have such a significant effect, which significantly increases predictive precision.

In addition, it is also conceivable to compare not just one single current value with at least one preceding value, but rather to form a first average from the currently ascertained value together with a predetermined number of previously and subsequently ascertained values which is compared with a second average that is composed in turn from previously measured values of the electrical variable. The second average is then for example determined from values of the electrical variable in which the connecting point is in an intact state, and not in a state of imminent damage. This average for example may be determined and saved upon initial operation of the connecting point.

In another embodiment, the predetermined significant change represents a predetermined portion of the at least one previously ascertained value. In other words, the predetermined significant change may be defined as a percent value relative to the at least one previously ascertained value. If the repeatedly ascertained electrical variable is in turn the voltage drop across the connecting point or the electrical resistance of the connecting point itself, the predetermined significant change is in turn a predetermined significant increase. In the event that the electrical variable represents the electrical conductivity of the connecting point, the predetermined significant change is again a predetermined significant decrease. In this case as well, "at least one previously ascertained value" may also be understood as an average of several previously ascertained values. For example, imminent damage to the connecting point may be considered recognized when the electrical resistance of the connecting point according to a currently ascertained value is higher by for example 5% in comparison to the average of several previously ascertained values of the resistance. The average does not necessarily have to be formed from values of the resistance ascertained immediately beforehand; instead, it may also be formed from resistance values that fall within a predetermined ascertainment period in which the connecting point is still fully intact. This may for example be an ascertainment period as of the initialization of the method, or respectively as of the first startup of the motor vehicle electrical system, or at least part of the motor vehicle electrical system, such as for example a battery that includes the two conductors with the connecting point. In general, the specific significant change at which imminent damage to the connecting point is considered recognized may lie within a range between 4 and 10%. Within such a range, an increase may be recognized of the resistance value, or other values of electric variables as well such as for example the voltage drop or also the conductivity as a result of imminent damage and, at the same time, there is still a sufficient interval from the actual damage, or respectively from a complete break of the connecting point, because of a limit value within such a range. This therefore enables a reliable and simultaneously also timely recognition of the imminent damage to the connecting point.

It is moreover also conceivable to plot an averaged curve using the values of the electrical variable ascertained up to a current point in time and, in the event that this curve rises to a predetermined significant extent, and/or its rise exceeds a predetermined limit value, imminent damage is recognized.

It is moreover beneficial if a warning signal is output when imminent damage is detected. For example, such a warning signal may be output to the driver in visual, acoustic or haptic form. In the simplest case, a warning lamp may light up, for example, or a note may also be output to the driver on a display, for example with a note to search for a workshop. Moreover, deactivation measures may also be initiated in a timely manner when imminent damage is detected such as for example disconnecting the relevant device that comprises the two conductors connected across the connecting point, such as for example disconnecting the battery by opening the main contactor so that worse consequences resulting from damage to the connecting point may be avoided.

Moreover and in another exemplary aspect, a device for a motor vehicle electrical system is provided, wherein the device has two electrical conductors that are connected to each other in an electrically conductive manner across a connecting point, and a measuring apparatus for predicting imminent damage to the connecting point between the two electrical conductors. In this case, the measuring apparatus is designed to ascertain a value of an electrical variable that is at least related to an electrical resistance of the connecting point, and to make the prediction of imminent damage depending on the value of the electrical variable. The measuring apparatus is furthermore configured so that the value of the electrical variable is repeatedly determined while the motor vehicle electrical system is in operation while an operating current of a determined operating current strength flows through the connection point.

The benefits mentioned with respect to the method according to the first exemplary aspect and its embodiments apply similarly to the device according to the present aspect. Moreover, the method steps mentioned in conjunction with the method according to the first exemplary aspect and its embodiments may also be used in further embodiments of the device according to the present aspect. The device may especially be designed as a battery, such as a high voltage battery. There are numerous connecting points particularly in high-voltage batteries, such as from welding or screwing joined conductors, so that monitoring these connecting points within a battery, such as a high voltage battery, is beneficial.

Moreover and in another exemplary aspect, a motor vehicle with a device according to the preceding aspect or its embodiments is provided. The mentioned benefits with respect to the device and its embodiments also apply to the motor vehicle.

The motor vehicle may for example be designed as a hybrid vehicle with an electric drive, or also for example as a pure electric vehicle in which the device designed as a battery serves as a traction battery.

In the following, further exemplary embodiments are described.

In the exemplary embodiments, the described components of the embodiments each represent individual features or components that may form an embodiment independent of each other, and should therefore be considered as a part of the invention individually, in combination, and in a combination other than shown. In addition, the described embodiments may also be supplemented by features or components, other than those already described.

Elements having the same or similar functions are, in each case, provided with the same reference numerals in the FIGS.

FIG. 1 shows a schematic representation of a motor vehicle 10 with a motor vehicle electrical network 12 that comprises a high-voltage battery 14. The motor vehicle electrical system 12 may comprise additional components that are not shown in greater detail here such as for example various consumers, power electronics, and an electric motor.

The high-voltage battery 14 comprises at least two electrical conductors 16a, 16b which are connected to each other in an electrically conductive manner across a connecting point 16c such as for example a joint, for example a weld seam. For example, the high-voltage battery 14 may comprise a plurality of such electrical conductors connected to each other across respective connecting points. Moreover, the high-voltage battery 14 has a measuring apparatus 18 that is designed to monitor and to predict imminent damage to the connecting point 16c. This will be described in greater detail with reference to FIG. 2.

Figure 2:
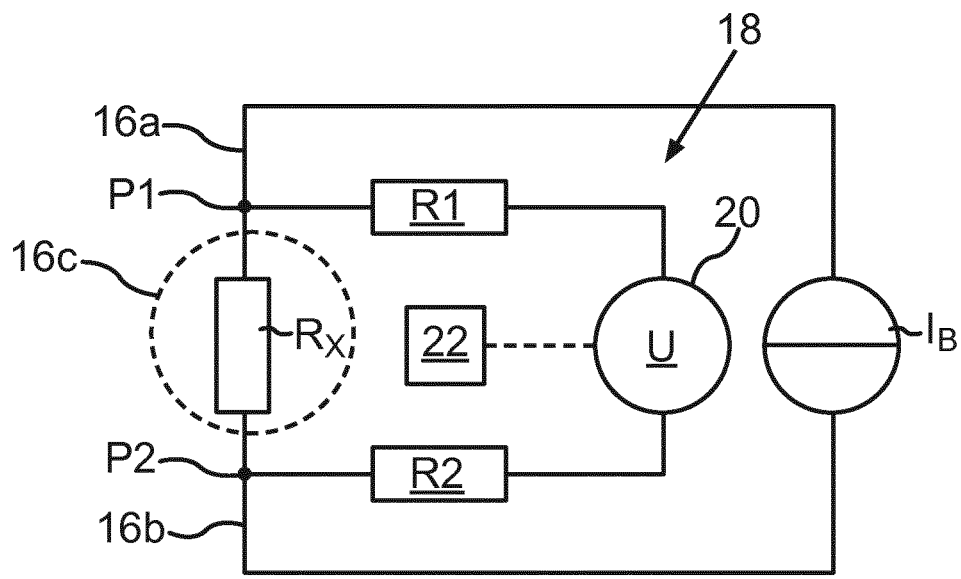
FIG. 2 shows a schematic representation of two electric conductors that are connected to each other in an electrically conductive manner across a connecting point, as well as a measuring apparatus for predicting imminent damage to the connecting point according to an exemplary embodiment.

FIG. 2 shows a schematic representation of two electrical conductors 16a, 16b which in turn are connected to each other in an electrically conductive manner across a connecting point 16c, for example a welded connection. The measuring apparatus 18 in this example comprises a voltage measuring unit 20 for measuring a voltage U that decreases across a connecting point 16c. This voltage U is measured while the motor vehicle electrical system 12 is operating, whereas an operating current $I_B$ that for example may be constant and is assumed to be known flows through the connecting point 16c. The electrical resistance Rx of the connecting point 16c may therefore be easily ascertained from the measured voltage drop U and the known operating current strength $I_B$. The measured voltage U is tapped in particular via two taps P1, P2, wherein a first tap P1 is located at the first conductor 16a, and the second tap P2 is located at the second conductor 16b. Moreover, these taps P1, P2 are at a predetermined proximity from the connecting point 16c, in particular such that no other components are located between these two taps P1, P2, just the connecting point 16c. Moreover the line resistances R1, R2 that are provided by the respective lines between the respective taps P1, P2 and the measuring unit 20 are large in comparison to the resistance Rx of the connecting point 16c itself, in particular larger by orders of magnitude, so that the current flowing through these lines and through the measuring unit 20 may be assumed to be negligibly small in comparison to the current $I_B$ flowing through the connecting point 16c. Then the electrical resistance Rx of the connecting point 16c easily results by dividing the voltage U tapped via the connecting point 16c and the current operating current strength $I_B$.

The value of the voltage U is repeatedly measured, for example initiated by suitable trigger signals or at predetermined intervals of time or the like, for example every five minutes, and transmitted to a control apparatus 22. The control apparatus 22 then ascertains the electrical resistance Rx of the connecting point from the currently measured value of the voltage U and the known current strength $I_B$ as described. Instead of the measuring unit 20 designed in this case as a voltage measuring unit, a resistance measuring unit such as a micro-ohm meter may for example also be used directly that, as described, directly determines the electrical resistance Rx from the voltage decreasing across the connecting point 16c, and only then correspondingly transmits it to the control apparatus 22 for further evaluation.

Using the repeatedly calculated resistance values Rx, the control unit 22 checks whether or not damage to the connecting point 16c is imminent. Damage does not necessarily have to be understood as a complete break of the connecting point 16c which leads to a complete separation of the two conductors 16a, 16b, but rather initial loosenings or a crack in the connecting point 16c. If imminent damage is correspondingly recognized by the control apparatus 22 depending on the ascertained, or respectively calculated resistance values Rx of the connecting point, the control apparatus 22 may emit a corresponding signal that for example triggers a warning to the driver, or for example also triggers a disconnection of the battery 14 from the remaining electrical system 12.

Imminent damage may in particular be recognized by a significantly rising characteristic of the electrical resistance Rx of the connecting point 16c. This will now be explained below in greater detail with reference to FIG. 3.

Figure 3:
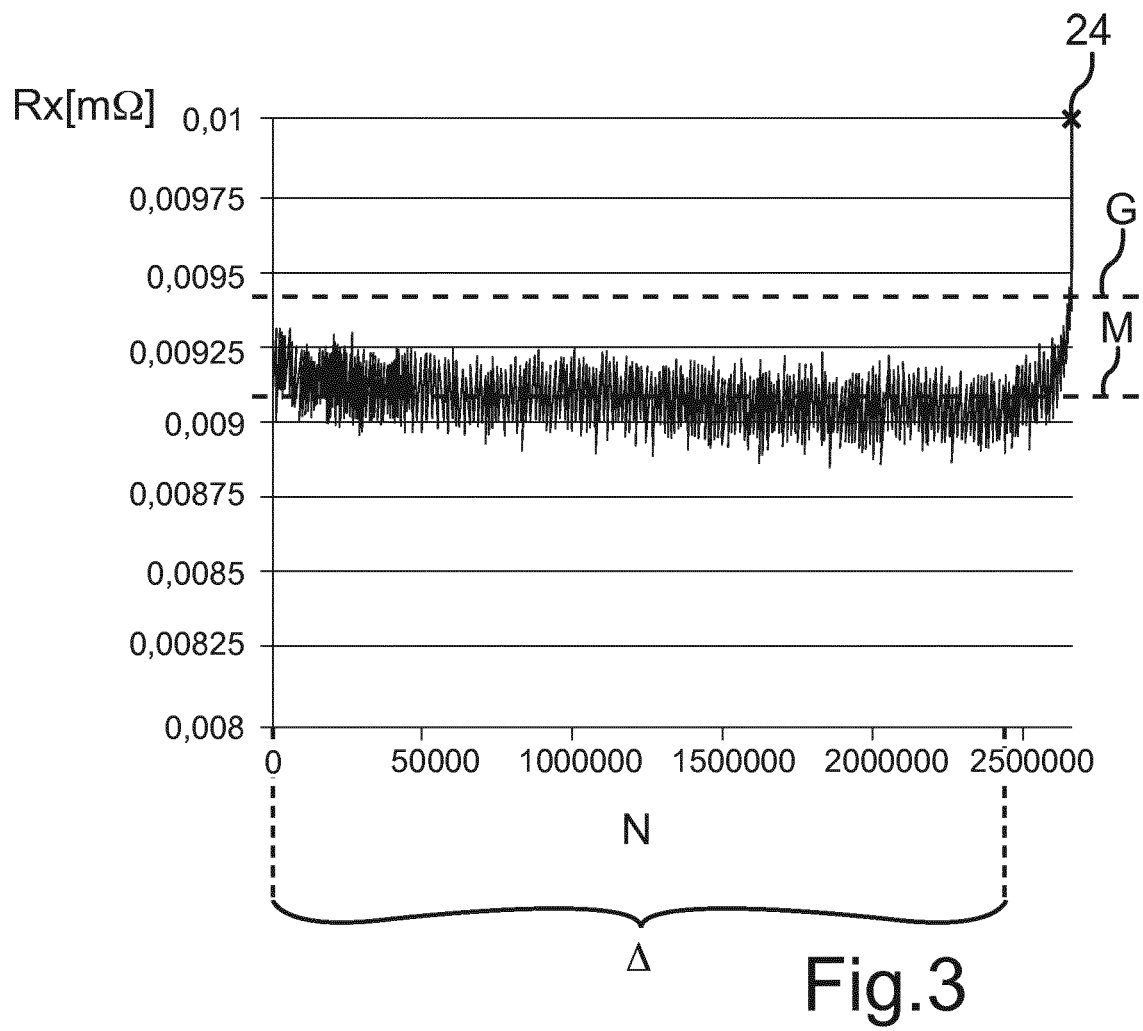
FIG. 3 shows a diagram for illustrating the dependency of the electrical resistance of a connecting point in the event of cyclical mechanical stress depending on the number of cycles until the connecting point is damaged.

FIG. 3 shows a graphic representation of repeatedly ascertained resistance values Rx under cyclical mechanical stress depending on the number N of cycles. Within the context of an experiment, a connecting point 16c between two electrical conductors 16a, 16b, or respectively the two electrical conductors 16a, 16b were mechanic stressed periodically under tension and in doing so, the electrical resistance Rx of the connecting point 16c was repeatedly measured as described with respect to FIG. 2. As may be seen from FIG. 3, the electrical resistance Rx remains nearly constant over many cycles 16c, and only before the damage to the connecting point that is designated by 24 in the graphic in FIG. 3 does the resistance Rx of the connecting point 16c rise significantly relative to the previous, nearly constant values. This rise may then be used to recognize imminent damage in a timely manner. A limit value G may hence for example be established for the resistance Rx and, when exceeded, imminent damage may be considered detected. This limit value G may be established as a percent value relative to an average M of a plurality of previously ascertained resistance values Rx. The average M in turn may be formed from a plurality of resistance values Rx that were ascertained at a certain interval A in which the connecting point 16c is in an intact state, and within which no significant rise of the resistance value Rx is observed. Alternatively, however, a predetermined number of sequentially ascertained resistance values Rx may also always be averaged, and once a rise in these average resistance values Rx is observed over several measuring points, such as over a predetermined number of sequential measuring points, imminent damage may be considered detected.

In this manner, the control apparatus 22 may hence beneficially recognize imminent damage 24 to the connecting point 16c in a timely manner depending on a consideration of a particular currently ascertained resistance value Rx with reference to the previously ascertained resistance values Rx. This has the significant benefit that, while the component is operating, a prediction of damage may be made without significant additional effort in situ. Since electrical current $I_B$ flows through the components during operation in any case, only the attachment of a measuring unit, such as for example the voltage measuring unit 20 described here, is necessary.

Overall, the example illustrates how a sudden component failure can be prevented in a timely manner by the invention since such a component failure, in particular damage to the connecting point, can be already predicted before it occurs. In doing so, the fact can be exploited that the electrical connection resistance correlates directly with the progression of the component damage, for example at welded connections. Only shortly before component failure occurs is a significant rise in the electrical connection resistance discernible. This allows reliable permanent monitoring of connecting points to be provided using particularly simple means.

LIST OF REFERENCE NUMERALS

10 Motor vehicle
12 Motor vehicle electrical system
14 High-voltage battery
16a First conductor
16b Second conductor
16c Connecting point
18 Measurement apparatus
20 Measuring unit
22 Control apparatus
24 Damage
G Limit value
$I_B$ Operating current
M Average
N Number of cycles
P1, P2 Tap
R1, R2 Line resistance
Rx Resistance of the connecting point
U Stress
Δ Interval The invention has been described in the preceding using various exemplary embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor, module or other unit or device may fulfil the functions of several items recited in the claims.

The mere fact that certain measures are recited in mutually different dependent claims or embodiments does not indicate that a combination of these measures cannot be used to advantage. Any reference signs in the claims should not be construed as limiting the scope.

What is claimed is:

1. A method for predicting imminent damage to a connecting point between two electrical conductors in a motor vehicle electrical system, comprising:
    during a first time period, determining at least one first measured value of an electrical variable that is proportional to an electrical resistance of the connecting point;
    during a second time period subsequent to the first time period, determining a series of second measured values by repeatedly determining the value of the electrical variable while the motor vehicle electrical system is in operation while an operating current of determined operating current strength flows through the connection point;
    comparing at least one of the second measured values of the electrical variable to the at least one first measured value of the electrical variable; and
    predicting imminent damage to the connecting point between the two electrical conductors based on the comparison.

2. The method of claim 1, wherein the electrical variable represents the electrical resistance of the connecting point, wherein the electrical resistance is determined by means of four-terminal measurement.

3. The method of claim 1, wherein a voltage drop across the connecting point is measured as the electrical variable.

4. The method of claim 1, wherein the imminent damage is predicted when the comparison indicates a change in value of the electrical variable that exceeds a predetermined change threshold.

5. The method of claim 4, wherein the predetermined change threshold is defined by a predetermined percentage of the at least one first measured value of the electrical variable.

6. The method of claim 1, wherein a warning signal is output when the imminent damage is predicted.

7. A device for a motor vehicle electrical system,
wherein the device has two electrical conductors that are connected to each other in an electrically conductive manner by a connecting point, and a measuring apparatus for predicting imminent damage to the connecting point between the two electrical conductors; and
wherein the measuring apparatus is configured to:
during a first time period, ascertain at least one first measured value of an electrical variable that is proportional to at least one electrical resistance of the connecting point;
during a second time period subsequent to the first time period, ascertain a series of second measured values by repeatedly determining the electrical variable while the motor vehicle electrical system is in operation while an operating current of a determined operating current strength flows through the connection point;
compare at least one of the second measured values to the at least one first measured value of the electrical variable; and
predict imminent damage to the connecting point between the two electrical conductors based on the comparison.

8. The device of claim 7, wherein the device comprises a high voltage battery.

9. A motor vehicle with a device of claim 7.

10. The method of claim 2, wherein the imminent damage is predicted when the comparison indicates a change in value of the electrical variable exceeds a predetermined change threshold.

11. The method of claim 3, wherein the imminent damage is predicted when the comparison indicates a change in value of the electrical variable exceeds a predetermined change threshold.

12. The method of claim 5, wherein the imminent damage is predicted when the comparison indicates a change in value of the electrical variable exceeds a predetermined change threshold.

13. The method of claim 1, comprising:
averaging multiple second measured values of the series of second measured values;
wherein the comparison step comprises comparing the average of the multiple second measured values to the at least one first measured value of the electrical variable.

14. The method of claim 1, wherein:
determining the at least one first measured value of the electrical variable comprises determining multiple first measured values of the electrical variable, and determining an average of the multiple first measured values; and
the comparison step comprises comparing the at least one of the second measured values of the electrical variable to the average of the multiple first measured values.

15. The device of claim 7, wherein the measuring apparatus is configured to:
average multiple second measured values of the series of second measured values; and
compare the average of the multiple second measured values to the at least one first measured value of the electrical variable.

16. The device of claim 7, wherein the measuring apparatus is configured to:
ascertain multiple first measured values of the electrical variable, and determining an average of the multiple first measured values; and
compare the at least one of the second measured values of the electrical variable to the average of the multiple first measured values.

17. The device of claim 7, wherein the measuring apparatus is configured to predict the imminent damage when the comparison indicates a change in the value of the electrical variable that exceeds a predetermined change threshold.

18. The device of claim 17, wherein the predetermined change threshold is defined by a predetermined percentage of the at least one first measured value of the electrical variable.

* * * * *